United States Patent
Zhang et al.

(10) Patent No.: US 10,446,511 B2
(45) Date of Patent: Oct. 15, 2019

(54) FAN-OUT STRUCTURE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hong Zhang, Shanghai (CN); Hae Wan Yang, Shanghai (CN); Yong Bin Huang, Shanghai (CN); Qian Zhou, Shanghai (CN); Chao Feng Zhou, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/981,522

(22) Filed: May 16, 2018

(65) Prior Publication Data
US 2018/0337152 A1  Nov. 22, 2018

(30) Foreign Application Priority Data
May 22, 2017 (CN) .......................... 2017 1 0363142

(51) Int. Cl.
H01L 23/00  (2006.01)

(52) U.S. Cl.
CPC .............. *H01L 24/06* (2013.01); *H01L 24/05* (2013.01); *H01L 2224/0235* (2013.01);
(Continued)

(58) Field of Classification Search
CPC . H01L 2224/05008; H01L 2224/06137; H01L 2224/0235; H01L 2224/02379; H01L 2224/02375; H01L 2224/02377; H01L 2224/02373; H01L 2224/0212; H01L 2224/02145; H01L 21/76816; H01L 23/4824; H01L 23/528; H01L 23/49838; H01L 24/04–06
See application file for complete search history.

(56) References Cited

U.S. PATENT DOCUMENTS 6,781,229 B1 * 8/2004 Fazelpour ........... H01L 23/5227
257/700
2016/0351517 A1 * 12/2016 Shi .......................... H01L 24/05
(Continued)

*Primary Examiner* — David A Zarneke
(74) *Attorney, Agent, or Firm* — Innovation Counsel LLP

(57) ABSTRACT

A fan-out structure and its manufacturing method are presented, relating to semiconductor techniques. The fan-out structure includes a welding pad; a welding pad extension member contacting the welding pad; and a fan-out line contacting the welding pad extension member, with an elicitation direction of the fan-out line perpendicular to an extension direction of the welding pad. This fan-out structure allows the fan-out line to be horizontally or vertically elicited from the welding pad, and thus remedies the drawbacks associated with an aslant-elicited fan-out line in conventional fan-out structures.

12 Claims, 3 Drawing Sheets

(52) U.S. Cl.
CPC .............. *H01L 2224/02373* (2013.01); *H01L 2224/02375* (2013.01); *H01L 2224/02379* (2013.01); *H01L 2224/02381* (2013.01); *H01L 2224/05569* (2013.01); *H01L 2224/0603* (2013.01); *H01L 2224/06137* (2013.01); *H01L 2924/14511* (2013.01)

(56) References Cited

U.S. PATENT DOCUMENTS

| | | | |
|---|---|---|---|
| 2017/0373032 A1* | 12/2017 | Oh | H01L 21/561 |
| 2018/0138150 A1* | 5/2018 | Eom | H01L 25/0657 |
| 2018/0301396 A1* | 10/2018 | Pan | H01L 23/4824 |

* cited by examiner

FAN-OUT STRUCTURE AND MANUFACTURE THEREOF

CROSS-REFERENCE TO RELATED APPLICATION

This application claims priority to and benefit of Chinese Patent Application No. 201710363142.8 filed on May 22, 2017, which is incorporated herein by reference in its entirety.

BACKGROUND

(a) Field of the Invention

This inventive concept relates generally to semiconductor techniques, and more specifically, to a fan-out structure and its manufacturing method.

(b) Description of the Related Art

In a conventional fan-out structure, such as a NAND flash memory word line fan-out structure, a fan-out line is a slant line elicited from a welding pad, this slant fan-out line is susceptible for defects and therefore needs to be thickened by Optical Correction (OPC). Nonetheless, the slant fan-out line in this fan-out structure attenuates neighboring horizontal or vertical fan-out lines and renders them vulnerable to defects. In conventional fan-out structures, it is difficult to trace whether a defect is a result of a manufacturing issue or a design fault, which impedes an effective removal of such a defect. Additionally, conventional fan-out structures require multiple welding pads to be symmetrically arranged and thus demand excessive space in horizontal direction.

SUMMARY

Based on the investigation to the issues in conventional techniques, this inventive concept presents an innovative solution that remedies at least some limitations of conventional techniques.

This inventive concept first presents a fan-out structure, comprising:
  a welding pad;
  a welding pad extension member contacting the welding pad; and
  a fan-out line contacting the welding pad extension member, with an elicitation direction of the fan-out line perpendicular to an extension direction of the welding pad.

Additionally, in the aforementioned fan-out structure, the welding pad extension member may comprise an L-shaped connection line that has a first member and a second member, with the first member perpendicular to the extension direction of the welding pad and the second member parallel with the extension direction of the welding pad, and the fan-out line may be an L-shaped fan-out line that has a first member and a second member, with the first member parallel with the extension direction of the welding pad and contacting a first end of the first member of the L-shaped connection line, and the second member contacting the second member of the L-shaped connection line.

Additionally, in the aforementioned fan-out structure, the welding pad extension member may further comprise:
  a T-shaped connection line that has a first member and a second member, wherein the first member of the T-shaped connection line is parallel with the extension direction of the welding pad and has a first end and a second end, with the first end contacting the first member of the L-shaped connection line and the second end contacting the first member of the L-shaped fan-out line, and the second member of the T-shaped connection line contacts the second member of the L-shaped connection line.

This inventive concept further presents a structure comprising a plurality of the aforementioned fan-out structures, with the L-shaped connection lines for different welding pads having different widths.

This inventive concept further presents a fan-out structure manufacturing method, comprising:
  providing a welding pad;
  forming a welding pad extension member at a side of the welding pad; and
  eliciting a fan-out line from the welding pad extension member along a direction perpendicular to an extension direction of the welding pad.

Additionally, in the aforementioned manufacturing method, providing a welding pad and forming a welding pad extension member at a side of the welding pad may comprise:
  forming an L-shaped connection line at a side of the welding pad;
  setting a first member of the L-shaped connection line to be perpendicular to the extension direction of the welding pad and contacting the welding pad; and
  setting a second member of the L-shaped connection line to be parallel with the extension direction of the welding pad.

Additionally, in the aforementioned manufacturing method, eliciting a fan-out line from the welding pad extension member along a direction perpendicular to an extension direction of the welding pad may comprise:
  forming an L-shaped fan-out line at a side of the L-shaped connection line;
  setting a first member of the L-shaped fan-out line to be parallel with the extension direction of the welding pad and contacting a first end of the first member of the L-shaped connection line;
  setting a second member of the L-shaped fan-out line to be perpendicular to the first member of the L-shaped fan-out line and contacting the second member of the L-shaped connection line.

Additionally, in the aforementioned manufacturing method, providing a welding pad and forming a welding pad extension member at a side of the welding pad may further comprise:
  forming a T-shaped connection line between the L-shaped connection line and the L-shaped fan-out line, wherein the T-shaped connection line has a first member and a second member, wherein the first member of the T-shaped connection line is parallel with the extension direction of welding pad and has a first end and a second end, with the first end contacting the first member of the L-shaped connection line and the second end contacting the first member of the L-shaped fan-out line, and the second member of the T-shaped connection line contacts the second member of the L-shaped connection line.

Additionally, the aforementioned manufacturing method may further comprise:
  forming a plurality of welding pads and a plurality of welding pad extension members, with the L-shaped connection lines for different welding pads having different widths.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
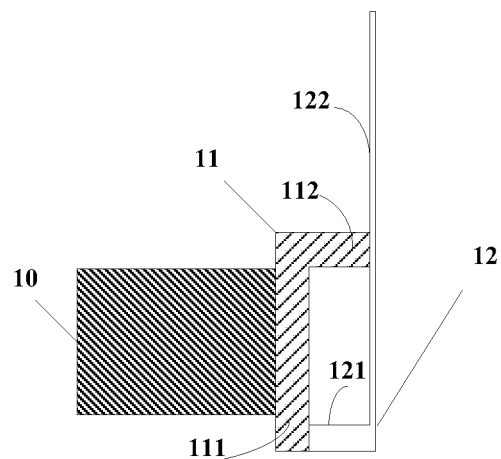
FIG. 1 shows a structure diagram illustrating a fan-out structure in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a structure diagram illustrating a fan-out structure in accordance with one embodiment of this inventive concept. Referring to FIG. 1, this fan-out structure comprises a welding pad 10, a welding pad extension member 11, and a fan-out line 12. The welding pad 10 contacts the welding pad extension member 11, the fan-out line 12 contacts the welding pad extension member 11, and an elicitation direction of the fan-out line 12 is perpendicular to an extension direction (a horizontal direction towards left in FIG. 1) of the welding pad 10.

In one embodiment, the welding pad extension member 11 comprises an L-shaped connection line, and the fan-out line 12 is an L-shaped fan-out line.

The L-shaped connection line contacts the welding pad 10, a first member 111 of the L-shaped connection line is perpendicular to the extension direction of the welding pad 10 and contacts the welding pad 10, and a second member 112 of the L-shaped connection line is parallel with the extension direction of the welding pad 10 and contacts a first end of the first member 111 of the L-shaped connection line. A first member 121 of the L-shaped fan-out line is parallel with the extension direction of the welding pad 10 and contacts a second end of the first member 111 of the L-shaped connection line, and a second member 122 of the L-shaped fan-out line contacts the second member 112 of the L-shaped connection line.

Figure 2:
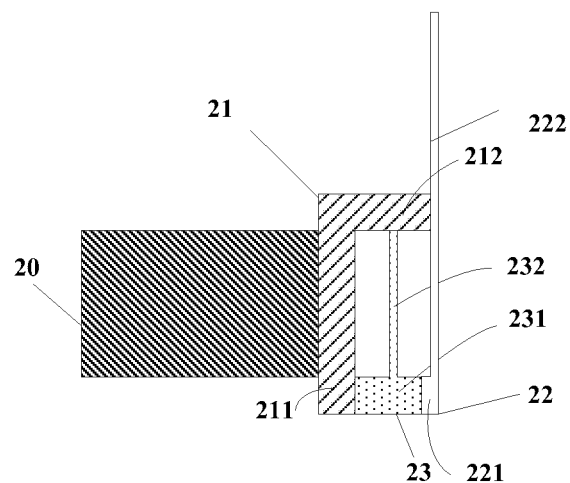
FIG. 2 shows a structure diagram illustrating a fan-out structure in accordance with another embodiment of this inventive concept.

Referring to FIG. 2, in another embodiment, a T-shaped connection line 23 may be placed between an L-shaped connection line 21 and an L-shaped fan-out line 22. A first member 231 of the T-shaped connection line 23 is parallel with an extension direction the welding pad 10, a first end of the first member 231 contacts the first member 211 of the L-shaped connection line 21, and a second end of the first member 231 contacts the first member 221 of the L-shaped fan-out line 22, a second member 232 of the T-shaped connection line 23 contacts the second member 212 of the L-shaped connection line 21.

In the embodiment described above, the L-shaped connection line and the L-shaped fan-out line together form a fan-out structure that has a fan-out line perpendicular to the extension direction of the welding pad, this a fan-out structure allows a fan-out line to be horizontally or vertically elicited from a welding pad, and thus remedies the drawbacks associated with a slant fan-out line in conventional fan-out structures.

Figure 3A:
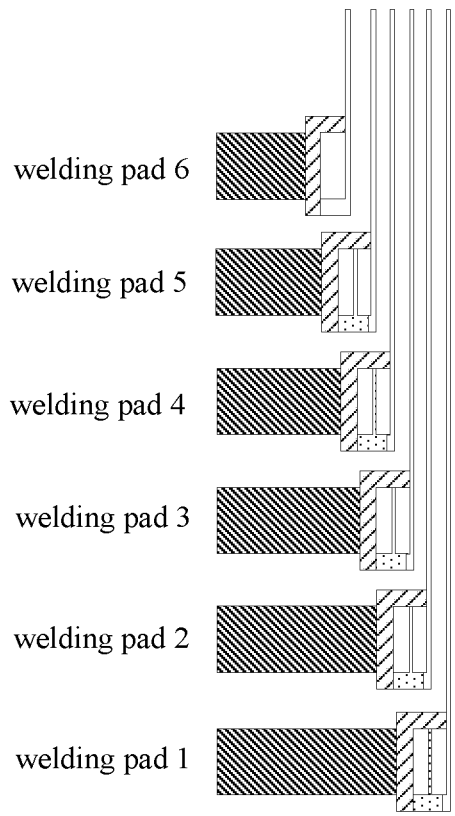
FIG. 3a shows a structure diagram illustrating a structure in accordance with a third embodiment of this inventive concept.

FIG. 3a shows a structure diagram illustrating a structure in accordance with a third embodiment of this inventive concept. Referring to FIG. 3a, welding pads 1-6 comprise a fan-out structure of this inventive concept. To ensure the fan-out lines in these welding pads do not block each other, the welding pads 1-6 may have different lengths. Since the fan-out lines can be vertically elicited from the welding pads 1-6, all the welding pads 1-6 may be vertically arranged along a straight line.

Figure 3B:
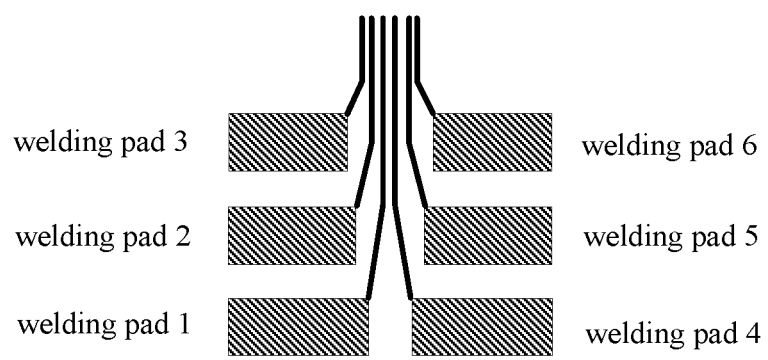
FIG. 3b shows a structure diagram illustrating a conventional fan-out structure.

As a comparison, in conventional fan-out structures, the fan-out lines are slant lines elicited from the welding pads, therefore the welding pads 1-6 need to be symmetrically arranged and occupy more space in horizontal direction than that in this inventive concept, as shown in FIG. 3b.

In one embodiment, the L-shaped connection lines for different welding pads may have different widths. For example, in FIG. 3a, the widths of the L-shaped connection lines connecting to welding pads 1-6 may be 145 nm, 130 nm, 115 nm, 100 nm, 80 nm, and 65 nm, respectively. This setting allows defect tracing in the fan-out structure. For example, if a defect is found on the L-shaped fan-out line connecting to a 100 nm L-shaped connection line and no defect is found on the L-shaped fan-out line connecting to a 115 nm L-shaped connection line, that means connecting an L-shaped fan-out line to an L-shaped connection line whose width is larger than or equal to 115 nm will not generate any manufacture defect, so any defect on such an L-shaped fan-out line is a result of a design fault rather than a manufacturing issue. On the other hand, connecting an L-shaped fan-out line to an L-shaped connection line whose width is less than or equal to 100 nm may cause defects in the manufacturing process.

In the embodiment described above, the fan-out structure of this inventive concept allows a fan-out line to be horizontally or vertically elicited from a welding pad, which allows a plurality of welding pads to be arranged vertically along a straight line and thus occupy less horizontal space than that in conventional methods. Additionally, by using L-shaped connection lines with different widths, a defect in the fan-out structure can be traced back to either a manufacturing issue or a design fault.

Figure 4:
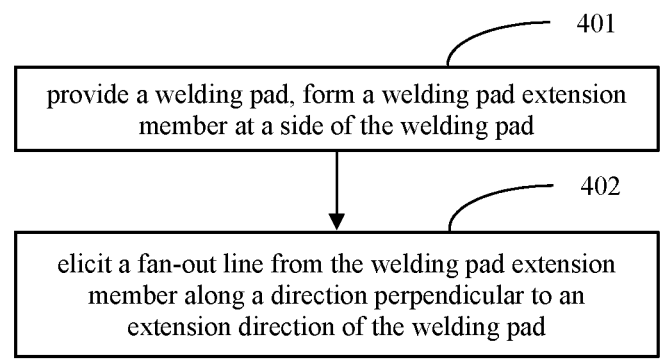
FIG. 4 shows a flowchart illustrating a fan-out structure manufacturing method in accordance with one embodiment of this inventive concept.

FIG. 4 shows a flowchart illustrating a fan-out structure manufacturing method in accordance with one embodiment of this inventive concept.

Referring to FIG. 4, in step 401, a welding pad is provided, a welding pad extension member is formed at a side of the welding pad.

In one embodiment, an L-shaped connection line may be formed at a side of the welding pad, a first member of the L-shaped connection line may be perpendicular to an extension direction of the welding pad and contact the welding pad, and a second member of the L-shaped connection line may be parallel with the extension direction of the welding pad and contact a first end of the first member of the L-shaped connection line.

In step 402, a fan-out line is elicited from the welding pad extension member along a direction perpendicular to the extension direction of the welding pad.

In one embodiment, an L-shaped fan-out line may be formed at a side of the L-shaped connection line, a first member of the L-shaped fan-out line may be parallel with the extension direction of the welding pad and contact a second end of the first member of the L-shaped connection line, and a second member of the L-shaped fan-out line may be perpendicular to the first member of the L-shaped fan-out line and contact both the first member of the L-shaped fan-out line and the second member of the L-shaped connection line.

In one embodiment, the manufacturing method may further comprise: forming a T-shaped connection line between the L-shaped connection line and the L-shaped fan-out line, a first member of the T-shaped connection line may be parallel with the extension direction of the welding pad, with its first end contacting the first member of the L-shaped connection line and its second end contacting the first member of the L-shaped fan-out line, a second member of the T-shaped connection line contacts the second member of the L-shaped connection line. The T-shaped connection line in the fan-out structure allows an adjustment on the distance between neighboring fan-out lines (and thus the wiring density). Additionally, by using L-shaped connection lines with different widths, a defect in the fan-out structure can be traced back to either a manufacturing issue or a design fault.

In the embodiment described above, the L-shaped connection line and the L-shaped fan-out line together form a fan-out structure that has a fan-out line perpendicular to the extension direction of the welding pad, this fan-out structure allows a fan-out line to be horizontally or vertically elicited from a welding pad, and thus remedies the drawbacks associated with a slant fan-out line in conventional fan-out structures.

This concludes the description of a fan-out structure and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed for reading the scope of the claims.

What is claimed is:

1. A fan-out structure, comprising:
a welding pad;
a welding pad extension member directly contacting the welding pad; and
a fan-out line directly contacting the welding pad extension member, wherein a lengthwise direction of the fan-out line is perpendicular to a lengthwise direction of the welding pad.

2. The structure of claim 1, wherein the welding pad extension member comprises an L-shaped connection line that has a first member and a second member, wherein the first member is perpendicular the second member parallel, wherein the fan-out line comprises a first section and a second section, wherein the first section directly contacts the first member, and wherein the second section directly contacts the second member.

3. The structure of claim 2, wherein the welding pad extension member further comprises:
a T-shaped connection line that has a first member and a second member, wherein the first member of the T-shaped connection line is parallel with the extension direction of the welding pad and has a first end and a second end, with the first end contacting the first member of the L-shaped connection line and the second end contacting the first member of the L-shaped fan-out line, and the second member of the T-shaped connection line contacts the second member of the L-shaped connection line.

4. A structure, comprising a plurality of the structure of claim 2, with the L-shaped connection lines for different welding pads having different widths.

5. A fan-out structure manufacturing method, comprising:
providing a welding pad;
forming a welding pad extension member at a side of the welding pad; and
providing a fan-out line that directly contacts the welding pad extension member, wherein a lengthwise direction of the fan-out line is perpendicular to a lengthwise direction of the welding pad.

6. The method of claim 5, wherein the welding pad extension member comprises:
a first member perpendicular to the lengthwise direction of the welding pad and directly contacting the welding pad; and
a second member parallel to the lengthwise direction of the welding pad and connected to the first member.

7. The method of claim 6, wherein the fan-out line comprises:
a first section parallel to the lengthwise direction of the welding pad and directly contacting the first member; and
a second section directly contacting the second member.

8. The method of claim 7, wherein providing a welding pad and forming a welding pad extension member at a side of the welding pad further comprises:
forming a T-shaped connection line between the L-shaped connection line and the L-shaped fan-out line, wherein the T-shaped connection line has a first member and a second member, wherein the first member of the T-shaped connection line is parallel with the direction of welding pad and has a first end and a second end, with the first end contacting the first member of the L-shaped connection line and the second end contacting the first member of the L-shaped fan-out line, and the second member of the T-shaped connection line contacts the second member of the L-shaped connection line.

9. The method of claim 6, further comprising:
forming a plurality of welding pads and a plurality of welding pad extension members, with the L-shaped connection lines for different welding pads having different widths.

10. The fan-out structure of claim 1, wherein a longest edge of the fan-out line is perpendicular to a longest edge of the welding pad.

11. The method of claim 5, wherein a longest edge of the fan-out line is perpendicular to a longest edge of the welding pad.

12. A fan-out structure, comprising:
a welding pad;
a welding pad extension member contacting the welding pad; and
a fan-out line contacting the welding pad extension member,
wherein the welding pad extension member comprises a first member and a second member directly connected to each other,
wherein the first member is perpendicular to a lengthwise direction of the welding pad,
wherein the second member is parallel to the lengthwise direction of the welding pad,
wherein the fan-out line comprises a first section and a second section directly connected to each other,
wherein the first section is perpendicular to the second section and directly contacts the first member, and
wherein the second section directly contacts the second member.

* * * * *